(12) United States Patent
Higashino et al.

(10) Patent No.: US 12,386,402 B2
(45) Date of Patent: Aug. 12, 2025

(54) ELECTRONIC DEVICE

(71) Applicant: Panasonic Intellectual Property Management Co., Ltd., Osaka (JP)

(72) Inventors: Nobuya Higashino, Osaka (JP); Ryusuke Teramoto, Osaka (JP); Masaru Furujiku, Osaka (JP); Yoshiyuki Harato, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 201 days.

(21) Appl. No.: 18/230,621

(22) Filed: Aug. 5, 2023

(65) Prior Publication Data

US 2023/0384844 A1 Nov. 30, 2023

Related U.S. Application Data

(63) Continuation of application No. PCT/JP2021/046470, filed on Dec. 16, 2021.

(30) Foreign Application Priority Data

Feb. 26, 2021 (JP) ................................. 2021-029418

(51) Int. Cl.
*G06F 1/20* (2006.01)
*H05K 7/20* (2006.01)

(52) U.S. Cl.
CPC ......... *G06F 1/203* (2013.01); *H05K 7/20145* (2013.01); *H05K 7/20154* (2013.01)

(58) Field of Classification Search
CPC combination set(s) only.
See application file for complete search history.

(56) References Cited

U.S. PATENT DOCUMENTS 7,511,956 B2 * 3/2009 Tomioka ................. G06F 1/203
174/15.2
7,649,736 B2 * 1/2010 Hongo ..................... G06F 1/203
361/679.48

(Continued)

FOREIGN PATENT DOCUMENTS

JP 2011-238063 A 11/2011
JP 2015-049591 A 3/2015

(Continued)

OTHER PUBLICATIONS

International Search Report for related Application No. PCT/JP2021/046470, mailed Feb. 8, 2022.

*Primary Examiner* — Lisa Lea-Edmonds
(74) *Attorney, Agent, or Firm* — Renner, Otto, Boisselle & Sklar, LLP

(57) ABSTRACT

An electronic device includes: a housing that has a first principal surface, a second principal surface on an opposite side of the first principal surface, and a side surface connecting the first principal surface and the second principal surface; a fan disposed inside the housing; an air passage disposed inside the housing and through which air sent from the fan passes; and a fin disposed in the air passage. The air passage extends from the fan toward the side surface. The housing has a recess recessed from the second principal surface toward the first principal surface and extending toward the side surface, at a position overlapping with the air passage in a plan view. The recess has a recessed surface facing the first principal surface, and a recess side surface positioned nearer to the fin than the side surface is in an extending direction of the air passage.

10 Claims, 8 Drawing Sheets

(56) References Cited

U.S. PATENT DOCUMENTS

| | | | |
|---|---|---|---|
| 8,692,169 B2 * | 4/2014 | Lin ...................... | F24C 15/101 |
| | | | 219/622 |
| 8,934,243 B2 * | 1/2015 | Ito .......................... | G06F 1/203 |
| | | | 361/679.48 |
| 8,988,878 B2 * | 3/2015 | Lin ........................ | G06F 1/203 |
| | | | 361/679.48 |
| 9,052,872 B2 * | 6/2015 | Iwamoto ............... | G06F 1/1656 |
| 9,070,922 B2 * | 6/2015 | Iwamoto ............ | H01M 50/244 |
| 9,213,377 B2 * | 12/2015 | Iwamoto ................ | G06F 1/184 |
| 9,367,102 B2 * | 6/2016 | Fujiwara ................ | G06F 1/203 |
| 9,608,243 B2 * | 3/2017 | Iwamoto ............ | H01M 50/247 |
| 9,612,634 B2 * | 4/2017 | MacDonald ........... | G06F 1/203 |
| 9,793,646 B2 * | 10/2017 | Iwamoto ............... | G06F 1/1656 |
| 9,939,860 B2 * | 4/2018 | Zhang ....................... | H02J 4/00 |
| 2010/0238619 A1 * | 9/2010 | Shirasaka ............... | G06F 1/203 |
| | | | 361/679.48 |
| 2011/0279974 A1 * | 11/2011 | Fujiwara ................... | G06F 1/20 |
| | | | 361/692 |
| 2013/0163171 A1 * | 6/2013 | Fujiwara .................. | H04N 5/64 |
| | | | 361/679.19 |
| 2014/0211420 A1 * | 7/2014 | Ou ........................... | H05K 7/20 |
| | | | 361/730 |
| 2015/0062805 A1 * | 3/2015 | Katsumata .............. | F28F 13/06 |
| | | | 361/679.49 |
| 2015/0062818 A1 * | 3/2015 | Horii ..................... | G06F 1/1616 |
| | | | 361/695 |
| 2019/0129480 A1 * | 5/2019 | Ku ...................... | H05K 7/20509 |
| 2019/0235586 A1 * | 8/2019 | Tani ........................ | H01Q 9/42 |
| 2020/0359530 A1 | 11/2020 | Uchino et al. | |
| 2020/0409436 A1 * | 12/2020 | Watanabe ............. | G06F 1/1698 |
| 2023/0384844 A1 * | 11/2023 | Higashino ........... | H05K 7/20145 |
| 2023/0393636 A1 * | 12/2023 | Takaoka ................ | H01L 23/467 |
| 2024/0385664 A1 * | 11/2024 | Takaoka ................ | H01L 23/467 |

FOREIGN PATENT DOCUMENTS

| | | |
|---|---|---|
| JP | 2015-053330 A | 3/2015 |
| JP | 2020-188033 A | 11/2020 |
| WO | 2011/067860 A1 | 6/2011 |
| WO | 2018/123119 A1 | 7/2018 |

* cited by examiner

ELECTRONIC DEVICE

TECHNICAL FIELD

The present disclosure relates to an electronic device.

BACKGROUND ART

There is a known electronic device including a housing for housing a blower, and has an exhaust port for discharging the air to the outside.

An electronic device described in PTL 1 includes a housing for housing a fan unit, for example. The housing has an intake port through which the external air is collected, a first exhaust port that opens to an air passage, and a second exhaust port that opens to a position different from the air passage.

The electronic device according to PTL 1 dissipates the heat inside the electronic device to the outside by absorbing the heat generated by internal electronic components with a heat pipe and heat-dissipating fins, and by causing the fan unit to blow the air against the heat-dissipating fins.

CITATION LIST

Patent Literature

PTL 1: Unexamined Japanese Patent Publication No. 2015-53330

SUMMARY OF THE INVENTION

The electronic device described in PTL 1 still has room for improvement in terms of downsizing the product while improving heat dissipation performance.

Accordingly, an object of the present disclosure is to provide a smaller electronic device with improved heat dissipation performance.

An electronic device according to one aspect of the present disclosure includes:
 a housing that has a first principal surface, a second principal surface on an opposite side of the first principal surface, and a side surface connecting the first principal surface and the second principal surface;
 a fan that is disposed inside the housing;
 an air passage that is disposed inside the housing and through which air sent from the fan passes; and
 a fin that is disposed in the air passage,
 wherein
 the air passage extends from the fan toward the side surface,
 the housing has a recess recessed from the second principal surface toward the first principal surface and extending toward the side surface, at a position overlapping with the air passage in a plan view,
 the recess has a recessed surface facing the first principal surface, and a recess side surface positioned closer to the fin than the side surface in an extending direction of the air passage, and that connects the second principal surface and the recessed surface,
 the side surface has a first exhaust port through which a part of air sent by the fan is discharged, and
 the recess side surface has a second exhaust port through which another part of the air sent from the fan is discharged.

The present disclosure provides a smaller electronic device with improved heat dissipation performance.

DESCRIPTION OF EMBODIMENT

Background to Invention

Figure 1:
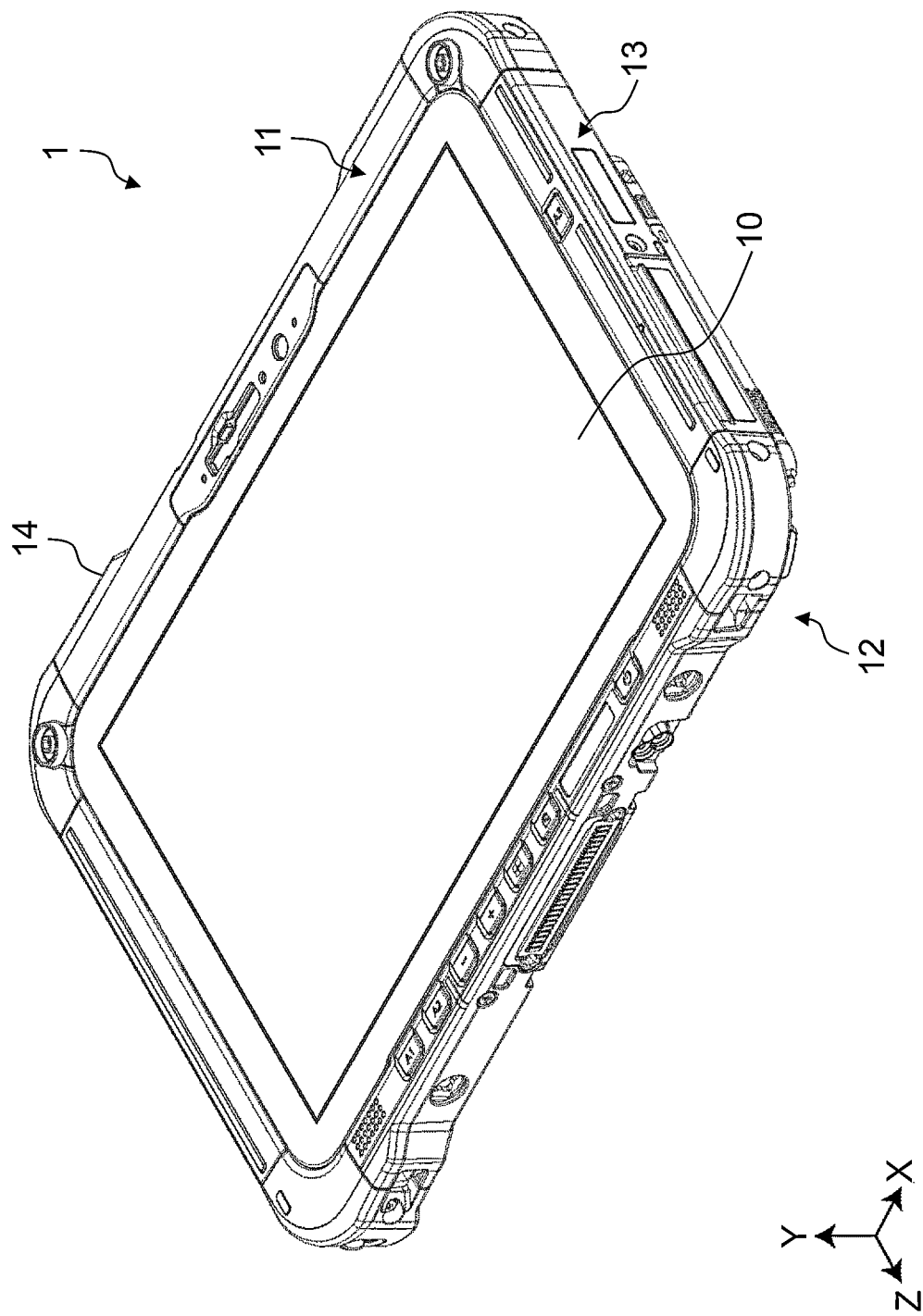
FIG. 1 is a perspective view of an electronic device according to a first exemplary embodiment.

Conventionally, in order to lower the temperature of a heat-generating component inside an electronic device, there is a known configuration including a fan that is disposed inside the electronic device, and that is caused to blow the air so that the internal heat is dissipated to the outside of the electronic device.

For example, PTL 1 discloses an electronic device that dissipates heat by causing a fan unit to blow the air against a heat-dissipating fin having absorbed heat from a heat-generating component. The air sent by the fan unit is discharged to the outside of the electronic device through the first exhaust port.

In order to ensure heat dissipation performance, it is preferable to provide an exhaust port the opening of which has a size substantially equal to the thickness of the heat-dissipating fins, on a side surface of the housing of the electronic device. At the same time, if the exhaust port is provided with a thickness substantially equal to the thickness of the heat-dissipating fins, it becomes difficult to reduce the thickness of the electronic device, so that the downsizing of the product is hindered, disadvantageously.

Therefore, the present inventors have experimented with electronic devices, and came up with the following invention that achieves downsizing while improving heat dissipation performance.

An electronic device according to one aspect of the present disclosure includes:
 a housing that has a first principal surface, a second principal surface on an opposite side of the first principal surface, and a side surface connecting the first principal surface and the second principal surface;
 a fan that is disposed inside the housing; and
 a fin that is disposed in an air passage that is disposed inside the housing and through which air sent from the fan passes,
 wherein
 the air passage extends from the fan toward the side surface,
 the housing has a recess recessed from the second principal surface toward the first principal surface and extending toward the side surface, at a position overlapping with the air passage in a plan view, the recess has a recessed surface facing the first principal surface, and a recess side surface that is positioned nearer to the fin than the side surface in an extending direction of the air passage and that connects the second principal surface and the recessed surface, the side surface has a first exhaust port through which air sent by the fan is discharged, and the recess side surface has a second exhaust port through which the air sent from the fan is discharged.

With such a configuration, it is possible to provide a smaller electronic device, while improving heat dissipation performance.

The first exhaust port may have a size larger than the size of the second exhaust port in the thickness direction of the housing.

Such a configuration can quickly discharge the high-temperature air having cooled the fins.

The second exhaust port may have an opening stretching across the second principal surface and the recess side surface.

Such a configuration enables the high-temperature air having cooled the fins to be discharged in two directions, so that the heat dissipation performance is improved.

The recessed surface may be flat.

Such a configuration can downsize at least a part of the end portion of the electronic device, therefore, contributes to downsizing of the product.

An antenna may be disposed on the recessed surface inside the housing.

Such a configuration enables the antenna to dissipate the heat of the air having cooled the fins, and improves the heat dissipation performance.

The recessed surface may be inclined toward with respect to the first principal surface toward the side surface.

In such a configuration, the channel of the air gradually becomes narrower toward the first exhaust port, so that the flow velocity can be increased, and the heat dissipation performance can be improved.

The fin may be disposed adjacently to the second exhaust port.

With such a configuration, the air having cooled the fin can be discharged directly to the outside of the electronic device, so that the heat dissipation performance can be improved.

The first exhaust port may include a plurality of first through holes, and the second exhaust port may be a plurality of second through holes.

With such a configuration, the first exhaust port and the second exhaust port may be provided as collections of a plurality of small through holes. Therefore, it is possible to prevent foreign substances from getting inside of the electronic device.

The first through hole may have a size larger than the size of the second through hole.

With such a configuration, by making the second through hole that is near the fin small, the flow velocity of the air from the second exhaust port can be increased, so that the heat dissipation performance can be improved.

Furthermore, a display unit may be provided on the first principal surface.

Such a configuration can provide a smaller tablet terminal with improved heat dissipation performance.

Exemplary embodiments will now be explained with reference to some drawings.

First Exemplary Embodiment

[General Configuration]

Figure 2:
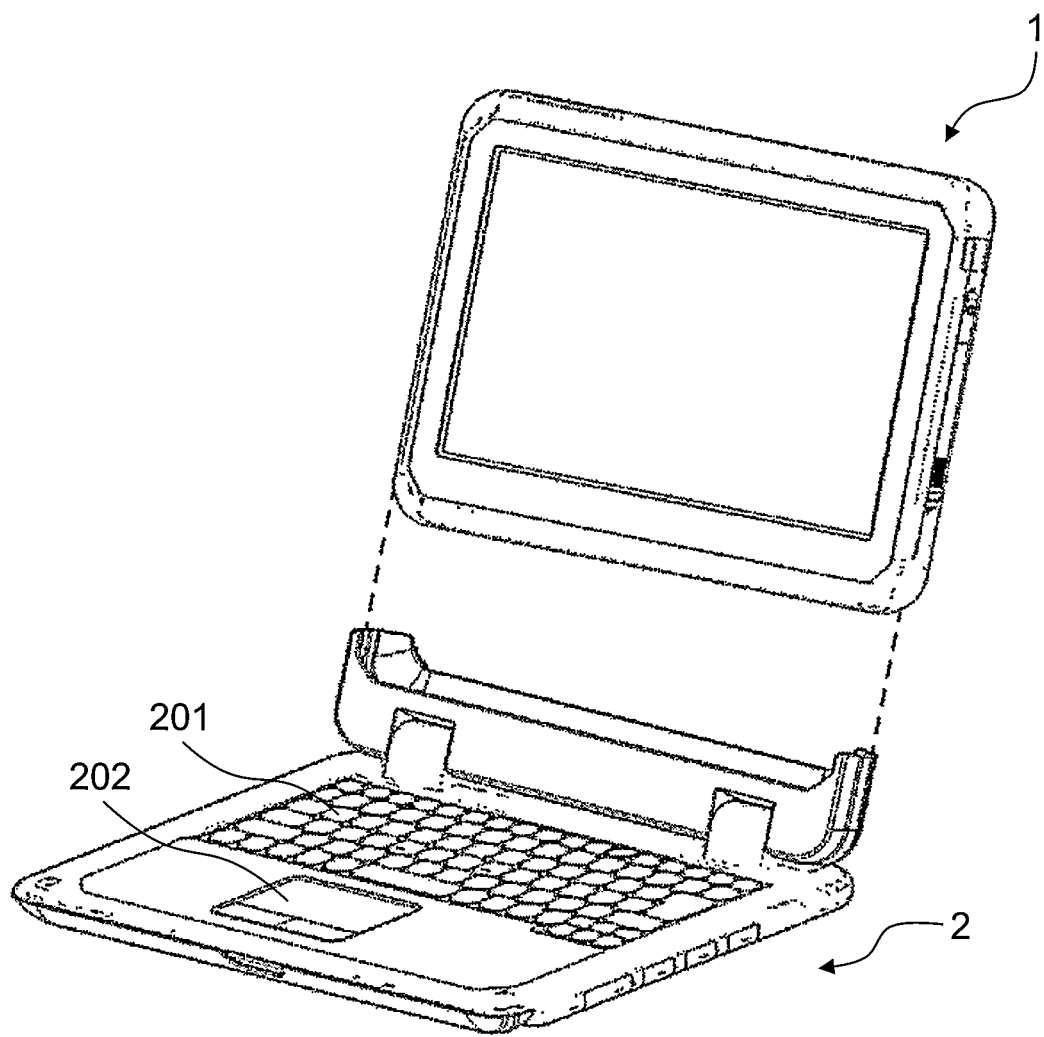
FIG. 2 is a schematic diagram of the electronic device in FIG. 1 used as a laptop PC.

FIG. 1 is an external perspective view of an electronic device 1 according to a first exemplary embodiment. FIG. 2 is a schematic diagram of electronic device 1 in FIG. 1 used as a laptop PC. The X-Y-Z coordinate system illustrated in the drawings is provided to facilitate the understanding of the exemplary embodiments, and is not intended to limit the scope of the exemplary embodiments in any way. In the X-Y-Z coordinate system, the X-axis direction corresponds to the width direction of the electronic device; the Y-axis direction corresponds to the depth direction; and the Z-axis direction corresponds to the thickness direction.

As illustrated in FIG. 1, electronic device 1 is a tablet terminal having display unit 10. As illustrated in FIG. 2, electronic device 1 may also be used as a laptop PC by connecting to keyboard unit 2 having input devices such as keyboard 201 and touch pad 202 thereto.

Figure 3:
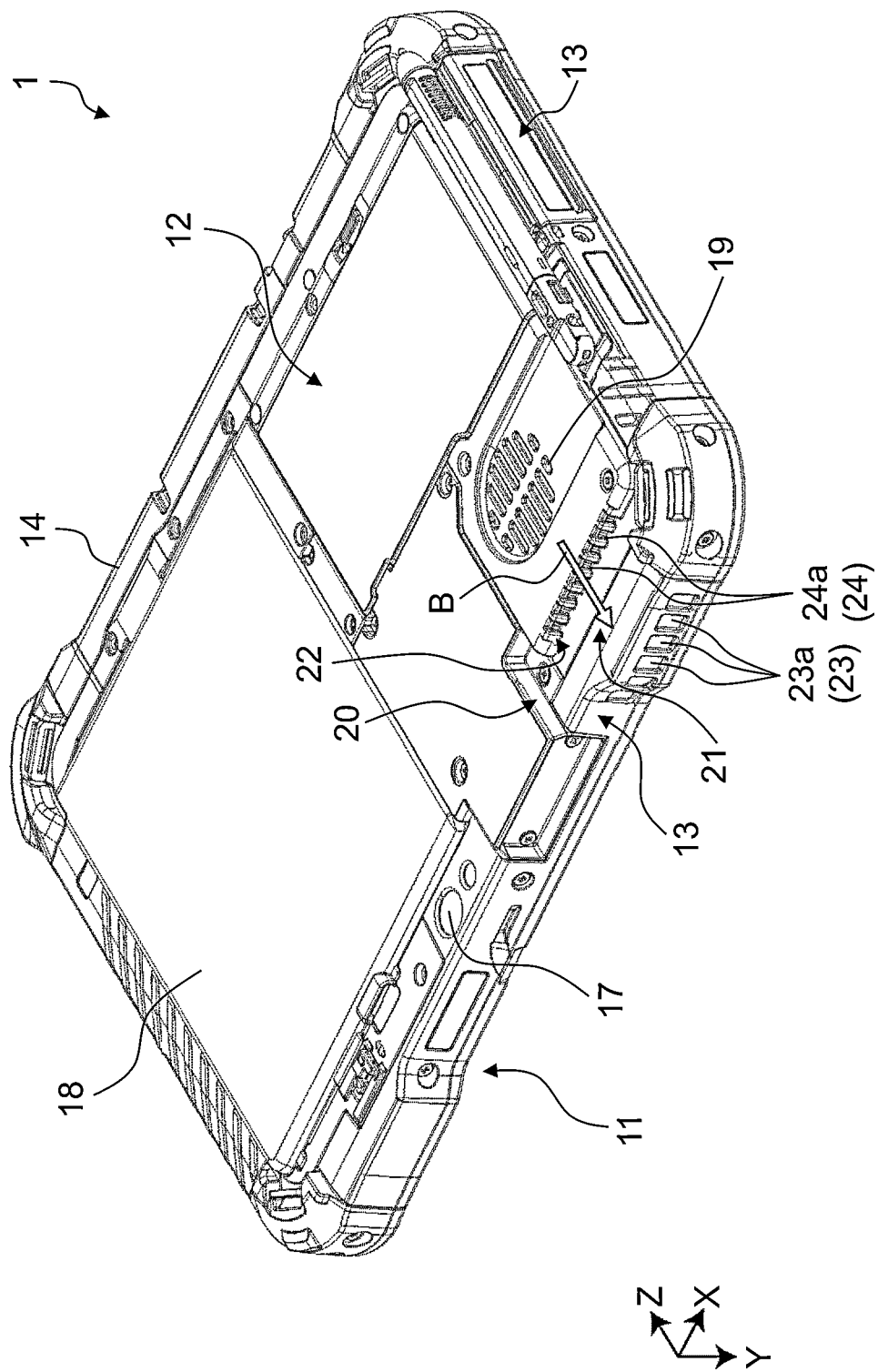
FIG. 3 is a perspective view of the electronic device in FIG. 1, as viewed from another direction.
Figure 4:
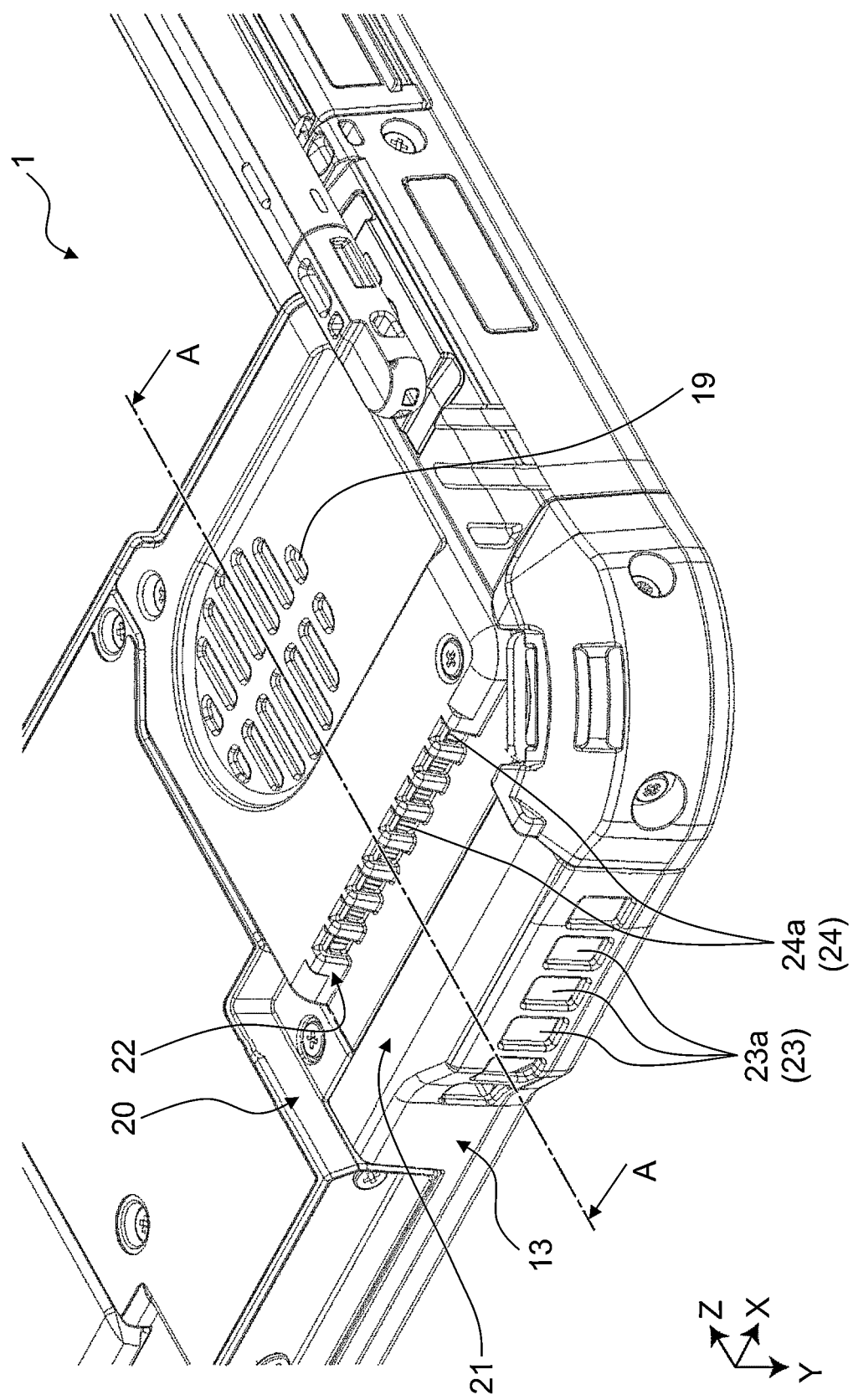
FIG. 4 is an enlarged view of a part of the electronic device in FIG. 3.
Figure 5:
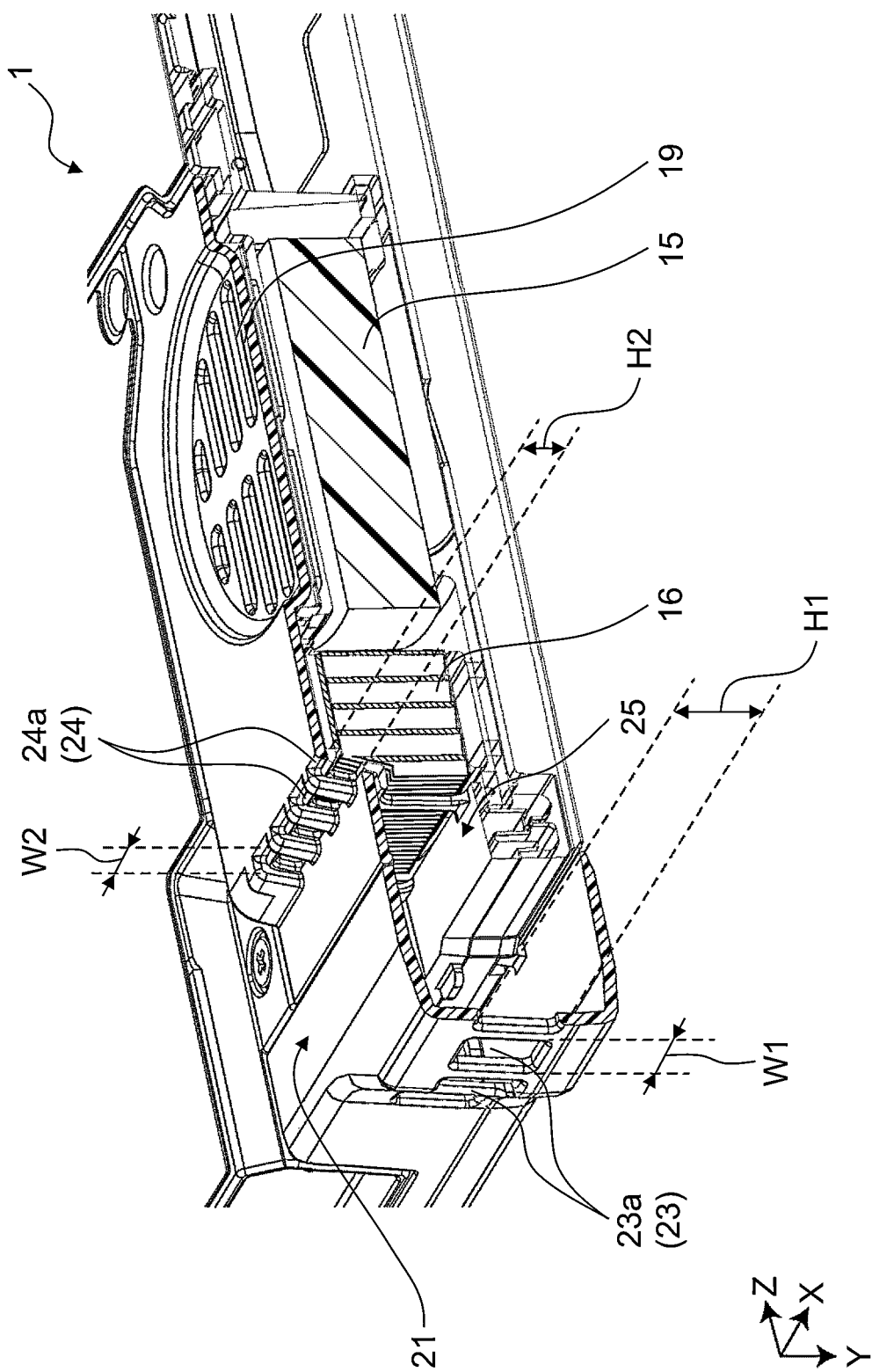
FIG. 5 is a cross-sectional perspective view of the electronic device in FIG. 4.
Figure 6:
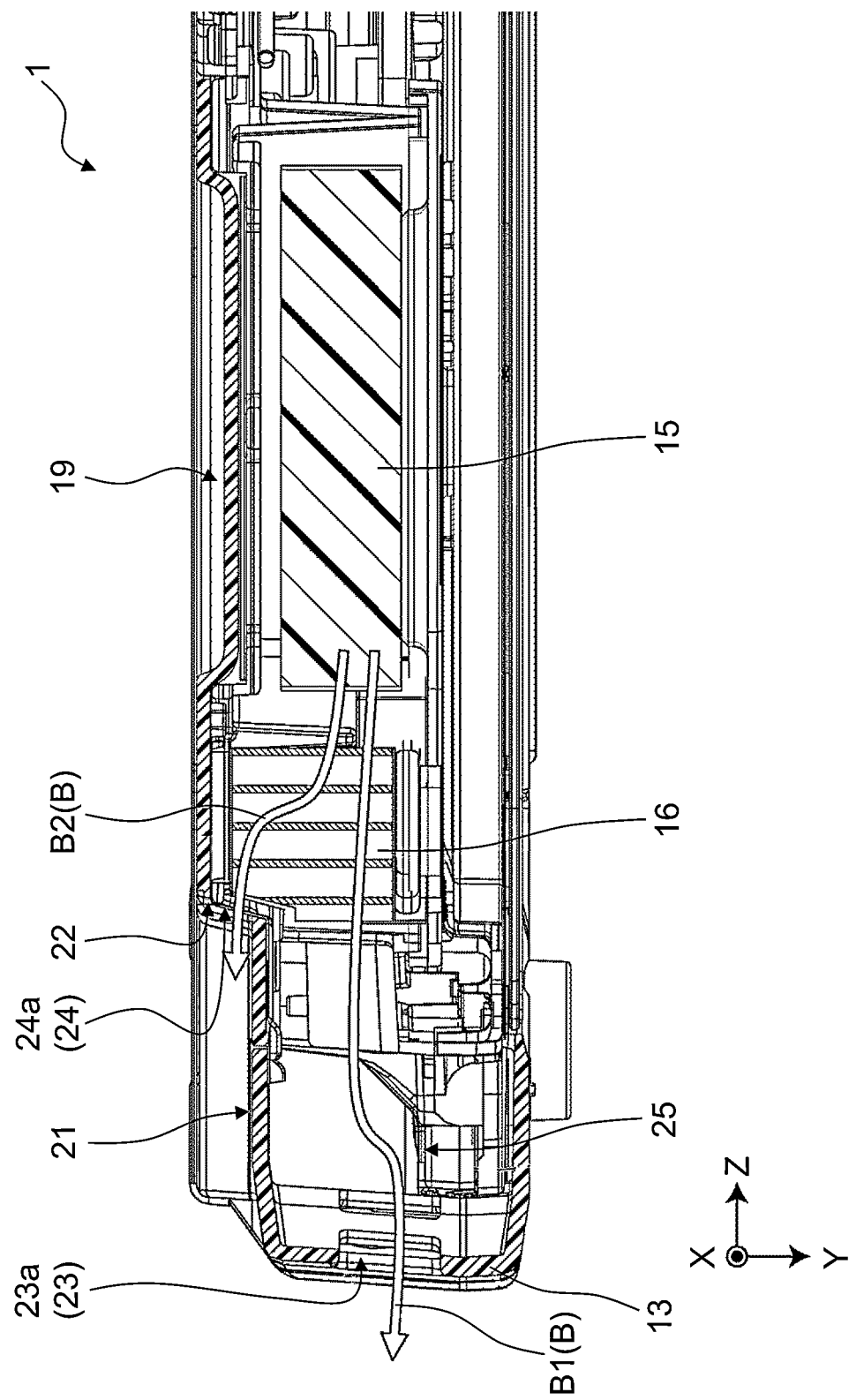
FIG. 6 is a cross-sectional view taken along line A-A of the electronic device in FIG. 4.

FIG. 3 is a perspective view of electronic device 1 in FIG. 1, as viewed from another direction. FIG. 4 is an enlarged view of a part of electronic device 1 in FIG. 3. FIG. 5 is a cross-sectional perspective view of electronic device 1 in FIG. 4. FIG. 6 is a cross-sectional view taken along line A-A of electronic device 1 in FIG. 4.

As illustrated in FIGS. 3 to 5, electronic device 1 includes housing 14, fan 15, and fins 16. Fan 15 and fins 16 are disposed inside housing 14.

<Housing>

As illustrated in FIGS. 1 and 3, housing 14 has first principal surface 11, second principal surface 12, and side surfaces 13 connecting first principal surface 11 and second principal surface 12. Display unit 10 is provided on first principal surface 11 of electronic device 1. Second principal surface 12 is a surface on the opposite side of first principal surface 11. Camera 17, battery pack 18, and the like are provided on second principal surface 12 of electronic device 1. Second principal surface 12 has intake port 19 through which the external air is collected by fan 15.

As illustrated in FIGS. 3 and 4, housing 14 has recess 20. Recess 20 is recessed from second principal surface 12 toward first principal surface 11 and extends toward side surface 13. Recess 20 is provided at a position overlapping with an air passage in a plan view, that is, in a view in the Y direction. The air passage is a passage for discharging the air from fan 15 to the outside of housing 14, and extends in the direction of arrow B illustrated in FIG. 3. The air passage includes air passage B1 extending from fan 15 to first exhaust port 23, and air passage B2 extending from fan 15 to second exhaust port 24 (see FIG. 6). Recess 20 has recessed surface 21 facing first principal surface 11, and recess side surface 22 connecting second principal surface 12 and recessed surface 21. Recess side surface 22 is positioned nearer to fins 16 than side surface 13 in the direction B in which the air passage extends.

Because recess 20 is provided, the thickness of a portion corresponding to recess 20 of housing 14 becomes smaller than other portions. Therefore, recess 20 contributes to downsizing of electronic device 1.

Recessed surface 21 in the present exemplary embodiment is flat.

First exhaust port 23 is provided on side surface 13. First exhaust port 23 is an outlet through which the air having passed through air passage B1 (see FIG. 6) is discharged.

First exhaust port 23 has a plurality of first through holes 23a. Second exhaust port 24 is provided on recess side surface 22. Second exhaust port 24 is an outlet through which the air having passed through air passage B2 (see FIG. 6) is discharged. Second exhaust port 24 has a plurality of second through holes 24a. First exhaust port 23 and second exhaust port 24 discharge the air from fan 15. In other words, first exhaust port 23 and second exhaust port 24 are outlets of the air sent by fan 15. More specifically, as illustrated in FIG. 6, first exhaust port 23 is an outlet for discharging a part of the air from fan 15, and second exhaust port 24 is an outlet for discharging another part of the air from fan 15. The air from fan 15 cools the heat absorbed by fins 16, and highly heated air resultant of cooling fins 16 is discharged from first exhaust port 23 and second exhaust port 24.

First exhaust port 23 having the plurality of first through holes 23a and second exhaust port 24 having the plurality of second through holes 24a prevent foreign substances from getting inside of housing 14 of electronic device 1. In addition, by changing the sizes of first through holes 23a and second through holes 24a, it is possible to change the size of the outlet of the air to the outside of housing 14, and to control the flow velocity of the discharged air.

In the thickness direction of housing 14, that is, in the Y direction, size H1 of first exhaust port 23 is larger than size H2 of second exhaust port 24 (see FIG. 5). Size H1 of first exhaust port 23 and size H2 of second exhaust port 24 herein correspond to the size of the openings in the Y direction. By reducing size H2 of second exhaust port 24, the air pressure difference is formed between those before and after the air have passed through second exhaust port 24, and therefore, can increase the flow velocity of the air discharged from second exhaust port 24. Therefore, the air is discharged from second exhaust port 24 at a higher flow velocity than that of the air discharged from first exhaust port 23. As will be described later, highly heated air resultant of cooling fins 16 is discharged from first exhaust port 23 and second exhaust port 24. By reducing the size H2 of second exhaust port 24, it is possible to increase the flow velocity of the air discharged from second exhaust port 24, so that the high-temperature air can be quickly discharged.

In the present exemplary embodiment, size W1 of first through hole 23a is larger than size W2 of second through hole 24a. Size W1 of first through hole 23a and size W2 of second through hole 24a correspond to the sizes of the respective openings in the X direction. By changing the size in the X direction, as well as the size in the Y direction, it is possible to control the flow velocity of the air.

<Fan>

As illustrated in FIG. 5, fan 15 is disposed inside housing 14 at a position overlapping with intake port 19. Fan 15 collects the air outside housing 14 through intake port 19, and sends the air toward first exhaust port 23 and second exhaust port 24. The air from fan 15 cools fins 16. An example of fan 15 includes a sirocco fan.

In the present exemplary embodiment, two exhaust ports that are first exhaust port 23 and second exhaust port 24 are provided. Therefore, as illustrated in FIG. 6, air passage B (see FIG. 3) from fan 15 is split inside of housing 14 into air passage B1 leading to first exhaust port 23 and air passage B2 leading to the second exhaust port. The air from fan 15 passes through air passage B1 and air passage B2, and is discharged to the outside of housing 14 through first exhaust port 23 and second exhaust port 24. Air passage B1 and air passage B2 extend from fan 15 in the −Z direction. In other words, air passage B1 and air passage B2 extend from fan 15 and toward side surface 13.

<Fins>

Fins 16 are disposed inside air passage B that extends from fan 15. By disposing fins 16 inside air passages B, the air from fan 15 is allowed to cool fins 16, to pass through air passage B1 and air passage B2, and to be discharged through first exhaust port 23 and second exhaust port 24.

Fins 16 are connected to a heat pipe (not illustrated) disposed inside housing 14. The heat pipe transfers the heat generated by a CPU (not illustrated) inside housing 14, to fins 16. The air from fan 15 cools fins 16. The air having cooled fins 16 is discharged from first exhaust port 23 and second exhaust port 24 to housing 14, to cool the CPU. In this manner, it is possible to prevent electronic device 1 from becoming overly heated.

In the present exemplary embodiment, fins 16 are disposed adjacently to second exhaust port 24. Because fins 16 are adjacent to second exhaust port 24, the highly heated air resultant of cooling fins 16 can be discharged quickly to the outside. Because the high-temperature air is discharged quickly through second exhaust port 24, it is possible to suppress the high-temperature air from remaining inside housing 14. Hence, the heat dissipation performance of electronic device 1 can be improved.

<Heat Dissipation>

Dissipation of heat from electronic device 1 will now be described with reference to FIGS. 5 and 6. Fan 15 is rotated about a rotation axis extending in the Y direction. When fan 15 is rotated, the air outside of housing 14 is collected into housing 14 through intake port 19. By rotating the fan 15, the collected air is passed through the air passage B1 and the air passage B2, and discharged through first exhaust port 23 and second exhaust port 24 to the outside of housing 14. Because fins 16 are disposed inside air passages B1 and B2, fins 16 are cooled by the air discharged from fan 15. The highly heated air resultant of cooling fins 16 is discharged through first exhaust port 23 and second exhaust port 24, so that the heat is dissipated from electronic device 1.

In the present exemplary embodiment, because two exhaust ports that are first exhaust port 23 and second exhaust port 24 are provided, the air from fan 15 is split into air passage B1 and air passage B2. Air passage B1 is a passage of the air from fan 15, passing through fins 16, and reaching first exhaust port 23. Air passage B2 is a passage of the air from fan 15, passing through fins 16, and reaching second exhaust port 24.

In the present exemplary embodiment, air passage B1 has duct 25 between fins 16 and first exhaust port 23. By contrast, air passage B2 is not provided with any duct between fins 16 and second exhaust port 24. By providing second exhaust port 24 adjacently to fins 16, the high heated air having cooled fins 16 can be discharged quickly through second exhaust port 24. Hence, the heat dissipation performance of electronic device 1 can be improved.

In general, in order to ensure heat dissipation performance, the sizes of exhaust ports 23 and 24 in the thickness direction (Y direction) of electronic device 1 are preferably substantially the same as the size of fins 16 in the Y direction. This is to discharge the air having cooled fins 16 efficiently. As in the present exemplary embodiment, by providing two exhaust ports 23 and 24, the size of each of exhaust ports 23 and 24 in the Y direction can be made smaller than the size of fins 16 in the Y direction. As a result, it is possible to reduce the thickness of a part of housing 14, so that the size of electronic device 1 can be reduced.

In the present exemplary embodiment, size H1 of first exhaust port 23 in the Y direction is larger than size H2 of second exhaust port 24 in the Y direction. Therefore, the flow velocity of the air from second exhaust port 24, which has a smaller size, is increased, and the high-temperature air passed through fins 16 can be discharged to the outside of housing 14 at a higher flow velocity than that of the air discharged from first exhaust port 23.

In the present exemplary embodiment, the opening of second exhaust port 24 stretches across second principal surface 12 and recess side surface 22. In this manner, because the openings are provided in a manner stretching across recess side surface 22 and second principal surface 12, air can be discharged more efficiently, so that heat dissipation efficiency can be improved.

[Effects]

The exemplary embodiment described above provides a smaller electronic device with improved heat dissipation performance.

By providing the two exhaust ports that are first exhaust port 23 and second exhaust port 24, it is possible to discharge the air from fan 15 through the two air passages that are air passage B1 and air passage B2. Because second exhaust port 24 is provided at a position near fins 16, the highly heated air resultant of cooling fins 16 can be discharged quickly, so that the heat dissipation performance can be improved.

Because the size of first exhaust port 23 is larger than the size of second exhaust port 24 in the thickness direction of housing 14, the flow velocity of the air discharged from second exhaust port 24 is increased. Therefore, the highly heated air having cooled fins 16 is discharged from second exhaust port 24 at a high flow velocity, so that the heat dissipation performance can be improved.

Furthermore, by providing recess 20 on second principal surface 12 of housing 14, the thickness of a part of housing 14 can be reduced. Therefore, it is possible to downsize electronic device 1.

Furthermore, because recess 20 is provided, a narrow path can be ensured in the duct extending from fins 16 to first exhaust port 23 internal of housing 14, so that the flow velocity of the air from fan 15 can be increased. Therefore, it is possible to discharge the highly heated air through first exhaust port 23, too, efficiently.

In addition, because second exhaust port 24 has an opening stretching across second principal surface 12 and recess side surface 22, it is possible to discharge the highly heated air resultant of cooling fins 16 efficiently, and to improve the heat dissipation performance of electronic device 1.

In addition, because recessed surface 21 of recess 20 is flat, when electronic device 1 is placed on a desk, a ground, or the like with second principal surface 12 facing downwards, a portion having recess 20 serves as a passage of the air discharged from second exhaust port 24. As described above, even when electronic device 1 is placed on a desk, a ground, or the like, with second principal surface 12 facing downwards, the air from fan 15 can be discharged efficiently, so that the heat dissipation performance can be improved.

Explained in the above exemplary embodiment is an example of first exhaust port 23 having a larger size than second exhaust port 24 in the thickness direction of housing 14, but it is not necessarily required for the size of first exhaust port 23 to be larger than the size of second exhaust port 24. For example, the size of first exhaust port 23 and the size of second exhaust port 24 may be approximately the same. Alternatively, the size of second exhaust port 24 may be larger than the size of first exhaust port 23.

Furthermore, the example explained above in the exemplary embodiment is an example including second exhaust port 24 having an opening stretching across second principal surface 12 and recess side surface 22, but second exhaust port 24 may have an opening at least on recess side surface 22.

Furthermore, explained above in the exemplary embodiment is an example including flat recessed surface 21, but it also possible for recessed surface 21 not to be flat. For example, recessed surface 21 may have a curved surface, or recessed surface 21 may have a recess or a protrusion.

In addition, explained above in the exemplary embodiment is an example including fins 16 that are disposed adjacently to second exhaust port 24, but the position of fins 16 is not limited thereto. Fins 16 may be disposed in such a manner that second exhaust port 24 is positioned nearer to fins 16 than first exhaust port 23.

In addition, explained above in the exemplary embodiment is an example including first exhaust port 23 including the plurality of first through holes 23a, and second exhaust port 24 including the plurality of second through holes 24a, but the present invention is not limited thereto. One of first exhaust port 23 and second exhaust port 24 may include a plurality of through holes. Alternatively, both of exhaust ports 23 and 24 may be one through holes, respectively.

In addition, explained above in the exemplary embodiment is an example including electronic device 1 that is a tablet terminal having display unit 10, but electronic device 1 is not limited to the tablet terminal. For example, electronic device 1 may be electronic device 1 such as a laptop PC or a desktop PC.

[First Modification]

Figure 7:
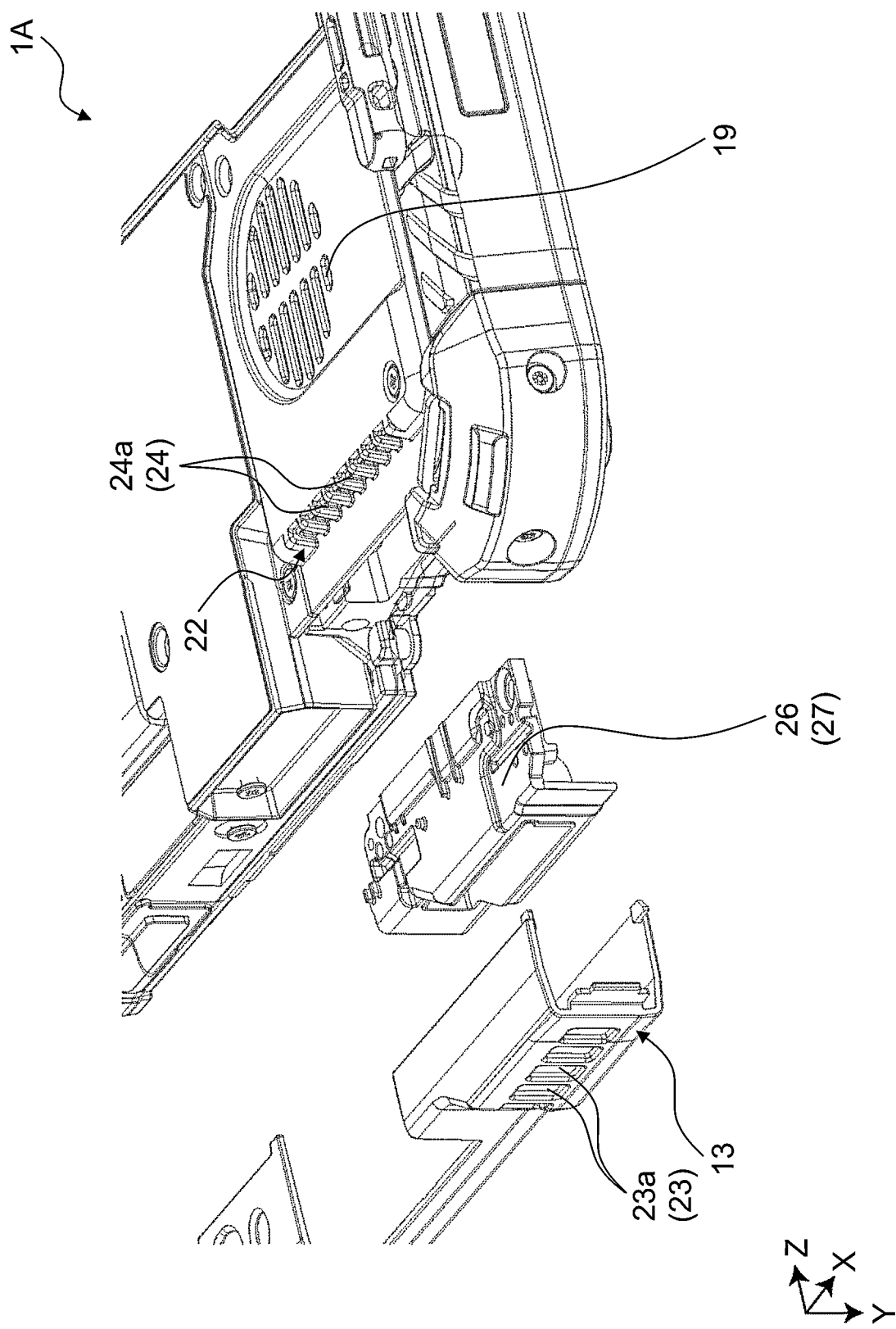
FIG. 7 is an exploded perspective view illustrating a part of an electronic device according to a first modification of the first exemplary embodiment.
Figure 8:
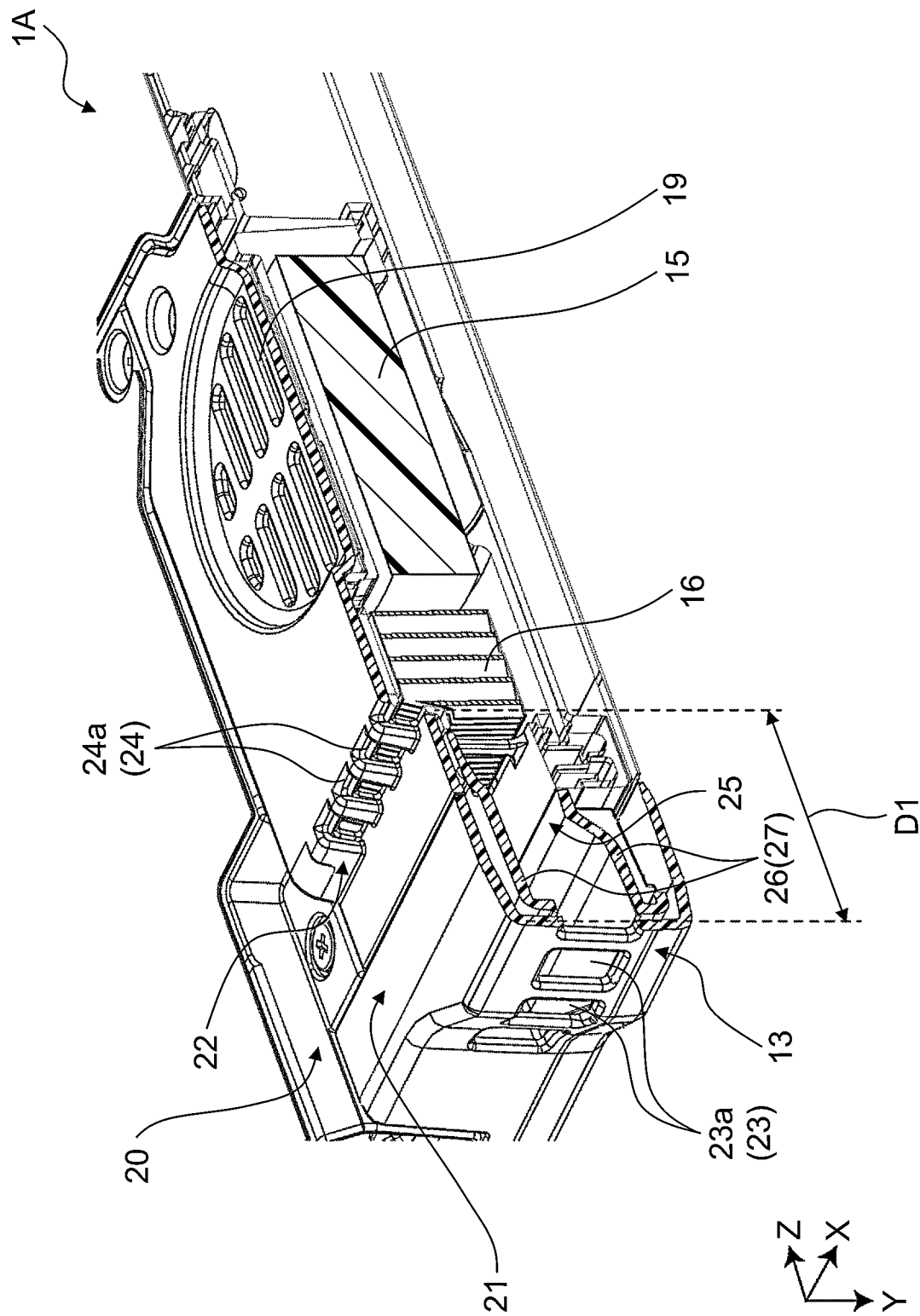
FIG. 8 is a cross-sectional perspective view illustrating a part of the electronic device in FIG. 7.

FIG. 7 is an exploded perspective view illustrating a part of an electronic device 1A according to a first modification of the first exemplary embodiment. FIG. 8 is a cross-sectional perspective view illustrating a part of electronic device 1A in FIG. 7.

As illustrated in FIGS. 7 and 8, in electronic device 1A, antenna 26 is disposed on recessed surface 21 inside housing 14. Specifically, resin component 27 including antenna 26 is disposed inside housing 14, on recessed surface 21. Antenna 26 can be formed by plating resin component 27, for example.

Antenna 26 is connected to a wireless communication module (not illustrated), for example, and transmits and receives radio waves to and from the outside, so as to connect electronic device 1 to a network, using a function of a wireless LAN, a wireless WAN, or the like. Because antenna 26 is made of a material having high thermal conductivity such as metal, by disposing antenna 26 on recessed surface 21, antenna 26 is allowed to dissipate the heat of the air flowing toward first exhaust port 23. Hence, the heat dissipation performance of electronic device 1A can be improved. In addition, by disposing antenna 26 on recessed surface 21 inside housing 14, it is possible to suppress performance deterioration of antenna 26. For example, when electronic device 1 is placed on a desk, a floor, or the like with second principal surface 12 of housing 14 facing downwards, it is possible to ensure a space between antenna 26 and the desk or the floor. As a result, it becomes possible to suppress interference of radio waves transmitted and received by antenna 26, and to suppress performance deterioration of antenna 26. For example, when a desk or a floor contains metal, performance degradation of antenna 26 can be further suppressed.

Recessed surface 21 may be inclined with respect to first principal surface 11 toward side surface 13. By providing such a recessed surface, antenna 26 can be disposed in a manner inclined with respect second principal surface 12. In this manner, even when some shielding object is disposed on the side of second principal surface 12 of housing 14, for example, deteriorations in radiation characteristics, reception characteristics, and/or directivity of antenna 26 can be suppressed.

Distance D1 between first exhaust port 23 and second exhaust port 24 in the Z direction is preferably 10 mm or more. When distance D1 between first exhaust port 23 and second exhaust port 24 is within this range, it is possible to achieve improvements in the characteristics of antenna 26, in addition to the improvement in the heat dissipation performance of electronic device 1A.

In addition, because recess 20 is provided, when electronic device 1A is disposed on a desk, a floor, or the like made of metal, with second principal surface 12 facing downwards, it is possible to prevent deteriorations in characteristics of antenna 26.

INDUSTRIAL APPLICABILITY

The present disclosure is applicable to a wide range of electronic devices that dissipate heat using fans and fins.

REFERENCE MARKS IN THE DRAWINGS 1, 1A electronic device
10 display unit
11 first principal surface
12 second principal surface
13 side surface
14 housing
15 fan
16 fin
20 recess
21 recessed surface
22 recess side surface
23 first exhaust port
23a first through hole
24 second exhaust port
24a second through hole
26 antenna

The invention claimed is:

1. An electronic device comprising:
a housing that has a first principal surface, a second principal surface on an opposite side of the first principal surface, and a side surface connecting the first principal surface and the second principal surface;
a fan that is disposed inside the housing;
an air passage that is disposed inside the housing and through which air sent from the fan passes; and
a fin that is disposed in the air passage,
wherein
the air passage extends from the fan toward the side surface,
the housing has a recess recessed from the second principal surface toward the first principal surface and extending toward the side surface, at a position overlapping with the air passage in a plan view,
the recess has a recessed surface facing the first principal surface, and a recess side surface that is positioned nearer to the fin than the side surface is in an extending direction of the air passage and that connects the second principal surface and the recessed surface,
the side surface has a first exhaust port through which a part of air sent by the fan is discharged, and
the recess side surface has a second exhaust port through which another part of the air sent from the fan is discharged.

2. The electronic device according to claim 1, wherein the first exhaust port has a size larger than a size of the second exhaust port in a thickness direction of the housing.

3. The electronic device according to claim 1, wherein the second exhaust port has an opening stretching across the second principal surface and the recess side surface.

4. The electronic device according to claim 1, wherein the recessed surface is flat.

5. The electronic device according to claim 1, further comprising an antenna disposed on the recessed surface inside the housing.

6. The electronic device according to claim 5, wherein the recessed surface is inclined with respect to the first principal surface toward the side surface.

7. The electronic device according to claim 1, wherein the fin is disposed adjacently to the second exhaust port.

8. The electronic device according to claim 1, wherein
the first exhaust port has a plurality of first through holes, and
the second exhaust port has a plurality of second through holes.

9. The electronic device according to claim 8, wherein a size of each of the plurality of first through holes is larger than a size of each of the plurality of second through holes.

10. The electronic device according to claim 1, further comprising a display unit disposed on the first principal surface.

* * * * *